US007395041B2

(12) United States Patent
Seppälä et al.

(10) Patent No.: US 7,395,041 B2
(45) Date of Patent: Jul. 1, 2008

(54) MOBILE PHONE AND METHOD OF UPDATING RADIO CHANNEL SETTINGS

(75) Inventors: Olli Seppälä, Tampere (FI); Niels Nymark, Hilleroed (DK)

(73) Assignee: Nokia Corporation, Espoo (FI)

( * ) Notice: Subject to any disclaimer, the term of this patent is extended or adjusted under 35 U.S.C. 154(b) by 1144 days.

(21) Appl. No.: 10/029,972

(22) Filed: Dec. 31, 2001

(65) Prior Publication Data

US 2003/0125076 A1 Jul. 3, 2003

(51) Int. Cl.
*H04B 1/18* (2006.01)
(52) U.S. Cl. .............. 455/186.1; 455/412.2; 455/466; 370/338
(58) Field of Classification Search ......... 455/418–420, 455/466, 550.1, 556.1, 179.1, 185.1, 186.1, 455/412.1, 412.2; 370/328, 338
See application file for complete search history.

(56) References Cited

U.S. PATENT DOCUMENTS

| | | | | |
|---|---|---|---|---|
| 4,481,382 A * | 11/1984 | Villa-Real | ................ | 455/556.1 |
| 5,898,910 A | 4/1999 | Miyake et al. | | |
| 5,909,184 A * | 6/1999 | Tajima | .................. | 340/825.27 |
| 6,014,561 A | 1/2000 | Mölne | | |
| 6,181,921 B1 * | 1/2001 | Konisi et al. | ............. | 455/186.2 |
| 6,282,412 B1 * | 8/2001 | Lyons | ..................... | 455/186.1 |
| 6,400,958 B1 * | 6/2002 | Isomursu et al. | ............ | 455/466 |
| 6,408,188 B1 * | 6/2002 | Park | ........................... | 455/466 |
| 6,470,178 B1 * | 10/2002 | Cummings-Hill et al. | ................. | 455/186.1 |
| 6,526,284 B1 * | 2/2003 | Sharp et al. | ............. | 455/456.6 |
| 6,553,013 B1 * | 4/2003 | Jones et al. | ................. | 370/328 |
| 6,597,918 B1 * | 7/2003 | Kim | ........................... | 455/466 |
| 6,631,261 B1 * | 10/2003 | Farber | ..................... | 455/432.1 |
| 2001/0009857 A1 * | 7/2001 | Vanttinen | ..................... | 455/456 |
| 2002/0055350 A1 * | 5/2002 | Gupte et al. | ................ | 455/412 |
| 2002/0137552 A1 * | 9/2002 | Cannon et al. | ............. | 455/567 |
| 2003/0069032 A1 * | 4/2003 | Jarvi et al. | ................... | 455/466 |
| 2003/0083028 A1 * | 5/2003 | Williamson | ............. | 455/186.1 |
| 2004/0171376 A1 * | 9/2004 | Engstrom et al. | .......... | 455/419 |

FOREIGN PATENT DOCUMENTS

| EP | 1 022 915 A1 | 7/2000 |
|---|---|---|
| GB | 2 247 121 A | 2/1992 |
| GB | 2 358 990 A | 8/2001 |

* cited by examiner

*Primary Examiner*—Edward Urban
*Assistant Examiner*—Nhan T. Le
(74) *Attorney, Agent, or Firm*—Banner & Witcoff, Ltd.

(57) ABSTRACT

A mobile phone is provided with a broadband AM and/or FM radio signal receiver. The mobile phone further has a radio channel memory for storing a plurality of radio channel settings. The mobile telephone further receives messages, such as SMS messages, and a storage for storing a radio channel setting contained in a received message in the radio channel memory. A method of updating radio channel settings of a mobile phone having a broadband AM and/or FM radio receiver is provided. The mobile phone receives messages. The message contains a radio channel setting. The radio channel setting may be stored in the mobile phone.

4 Claims, 5 Drawing Sheets

MOBILE PHONE AND METHOD OF UPDATING RADIO CHANNEL SETTINGS

BACKGROUND OF THE INVENTION

1. Field of the Invention

The present invention relates to methods of updating radio channel settings of a mobile phone, in particular methods of sending messages such as the Global System for Mobile communications System Short Message Service. Further, the invention relates to mobile phones, in particular to mobile phones capable of sending and receiving text messages and having a broadband radio receiver.

2. Description of the Prior Art

Mobile phones that can also exchange information using protocols such as the Short Message Service (SMS) part of the Global System for Mobile communications (GSM) digital standard are well known in the art. Conventional SMS messages may be plain text messages or messages containing a particular type of information such as ringing tones, picture messages, WAP settings and business cards (Vcard). Recently, mobile phones with broadband radio receivers such as the Nokia® 8310 and 6510 have come on the market. The receiver is controlled through a user interface comprising a display and a keypad. The radio functions of the phone can thus be controlled without any keys being solely dedicated only to the radio functions. A number of radio stations can be stored and recalled. By nature, mobile phones are used in changing locations. It is therefore not unlikely that the radio channel settings stored in the phone are no longer useful because the signal the stored channels is too weak to be received in a changed location of the mobile phone.

SUMMARY OF THE INVENTION

The present invention provides a mobile phone, which overcomes the above-mentioned problem. The invention provides a mobile phone capable of recognizing that a text message service contains a radio channel setting and a storage for storing the received radio channel in a radio channel memory.

Preferably, the mobile phone further comprises a detector for detecting that a message contains a radio channel setting.

A menu of the mobile phone user interlace may be activated when a message containing a radio channel setting is received, the menu prompting the user to choose to either listen to the received radio channel, save the received radio channel setting, view the details of the received radio channel setting, or discard the channel setting.

Also, a further menu of the user interface may be activated when the user has chosen to save the radio channel setting, the further menu requesting the user to select one of the channel location numbers of the radio channel memory.

The mobile phone may further send a message containing a radio channel setting, so that mobile phone users may keep one another updated about interesting channels.

Preferably, the detector for detecting that a message contains a radio channel setting determines the type of content of the message from the user data header of the message.

The mobile phone comprises in a preferred embodiment a receiver to receive messages containing radio channel frequency and/or name and time and date of a radio program.

In this preferred embodiment, the mobile telephone further activates the broadband AM and/or FM radio signal receiver and tunes it to the received channel when the time and date of the received radio program has been reached.

The present invention is a method which overcomes the above-mentioned problem. The method updates radio channel settings of a mobile phone in which a message containing a radio channel setting is sent to the mobile phone.

The radio channel setting in the message may comprise a radio channel frequency, and/or radio channel name and/or radio program starting time and date as well as other information.

According to a preferred embodiment, the mobile phone comprises a radio channel memory for storing a plurality of radio channel settings, and the method comprises the step of storing a radio channel contained in the message to the radio channel memory.

According to another preferred embodiment, the mobile phone comprises a radio channel memory for storing a plurality of radio channel settings, further comprising the step of storing a radio channel contained in the message to the radio channel memory.

The method of updating the radio channel setting may further comprise the steps of:

assigning particular radio channel settings to different geographical areas, determining in which geographical area the mobile phone is located, and sending a message to the mobile phone, containing at least one radio channel setting assigned to the geographical area in which the mobile phone is located.

Preferably, the message containing at least one radio channel setting assigned to the geographical location in which the phone is located is sent when the mobile phone has moved from one geographical area to another or when the mobile phone logs on to the network in the geographical area.

Preferably, the broadband AM and/or FM radio receiver is automatically tuned to the last radio channel setting that is received.

The radio channel setting may include a date and time, and the broadband AM and/or FM radio receiver may be automatically switched on and tuned to the received radio channel setting.

According to yet another embodiment of the invention, a message requesting a particular radio station setting or settings is sent to a server and the message containing the requested radio station setting or settings is returned by the server. In the message to the server, a particular radio station setting or settings for a particular geographical area or a number of particular areas along a route may be requested.

A message containing the requested radio station setting or settings is returned by the server. In the message to the server, a particular radio station setting for a particular geographical area or a number of particular areas along a route may be requested.

Further objects, features, advantages and properties of the invention will become apparent from the detailed description.

BRIEF DESCRIPTION OF THE DRAWINGS

In the following detailed portion of the present description, the invention will be explained in more detail with reference to the exemplary embodiments shown in the drawings, in which.

DETAILED DESCRIPTION OF THE PREFERRED EMBODIMENTS

Figure 1:
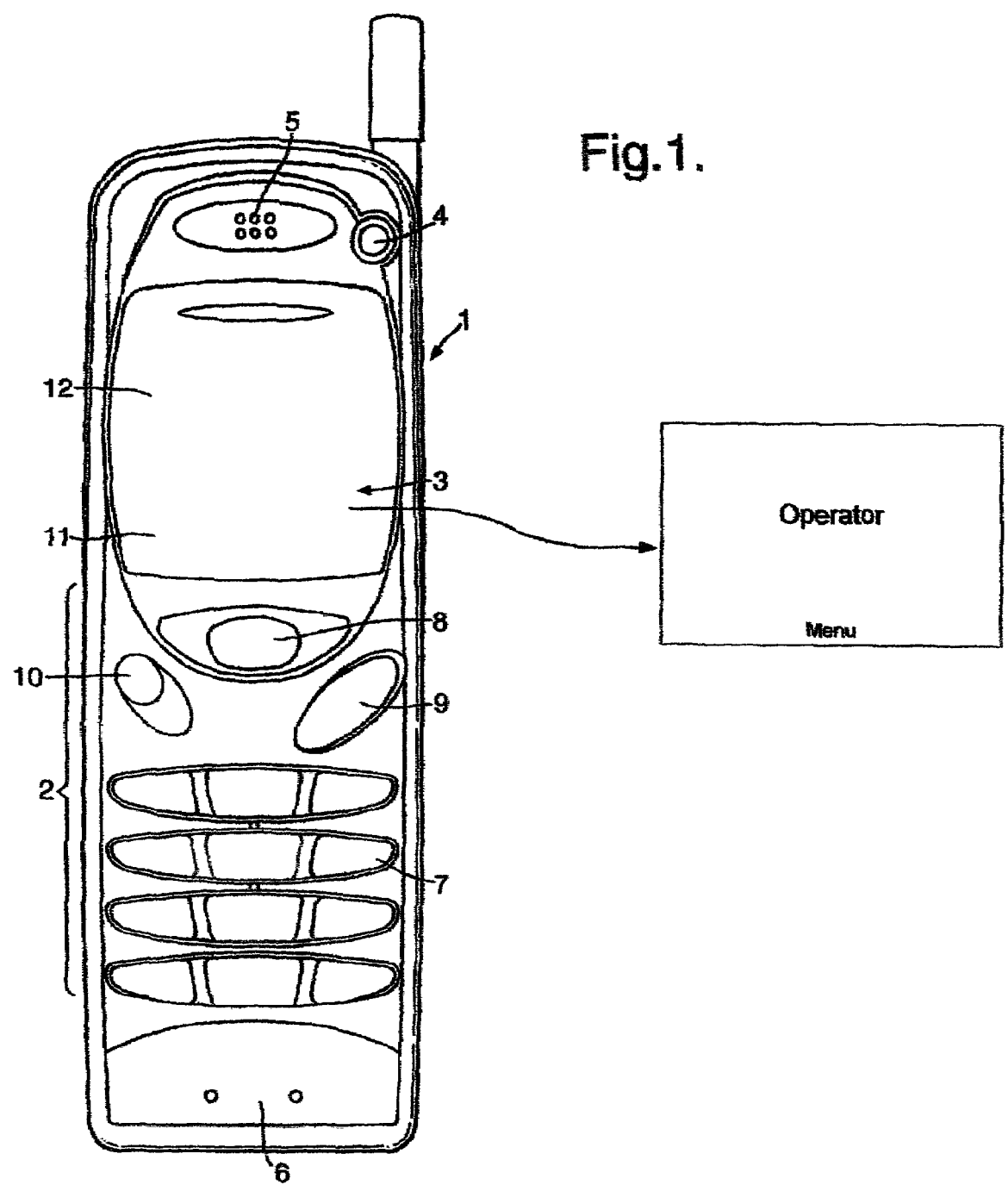
FIG. 1 is a diagrammatic view of a mobile phone.
Figure 2:
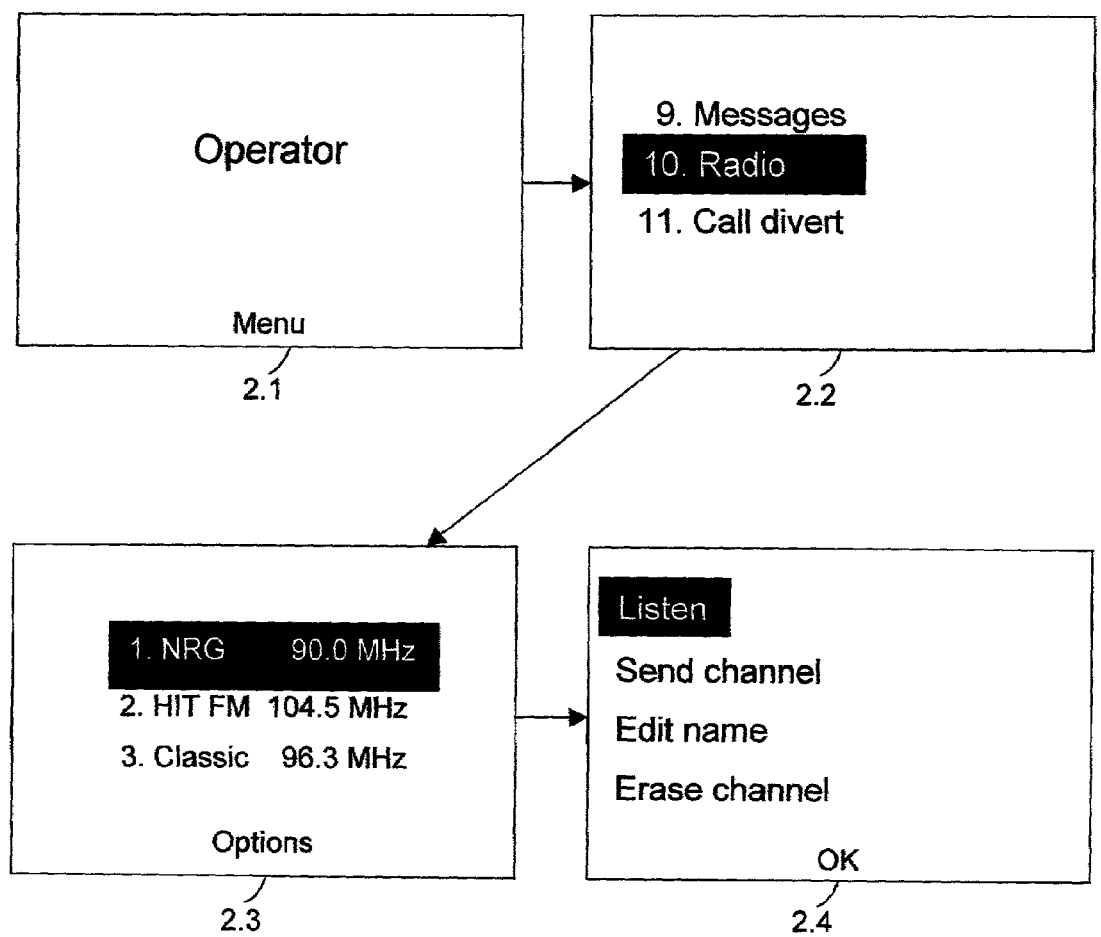
FIGS. 2, 2a, 3 and 4 are flowcharts illustrating the user interlace of the mobile phone that relates to the radio functions.
Figure 2A:
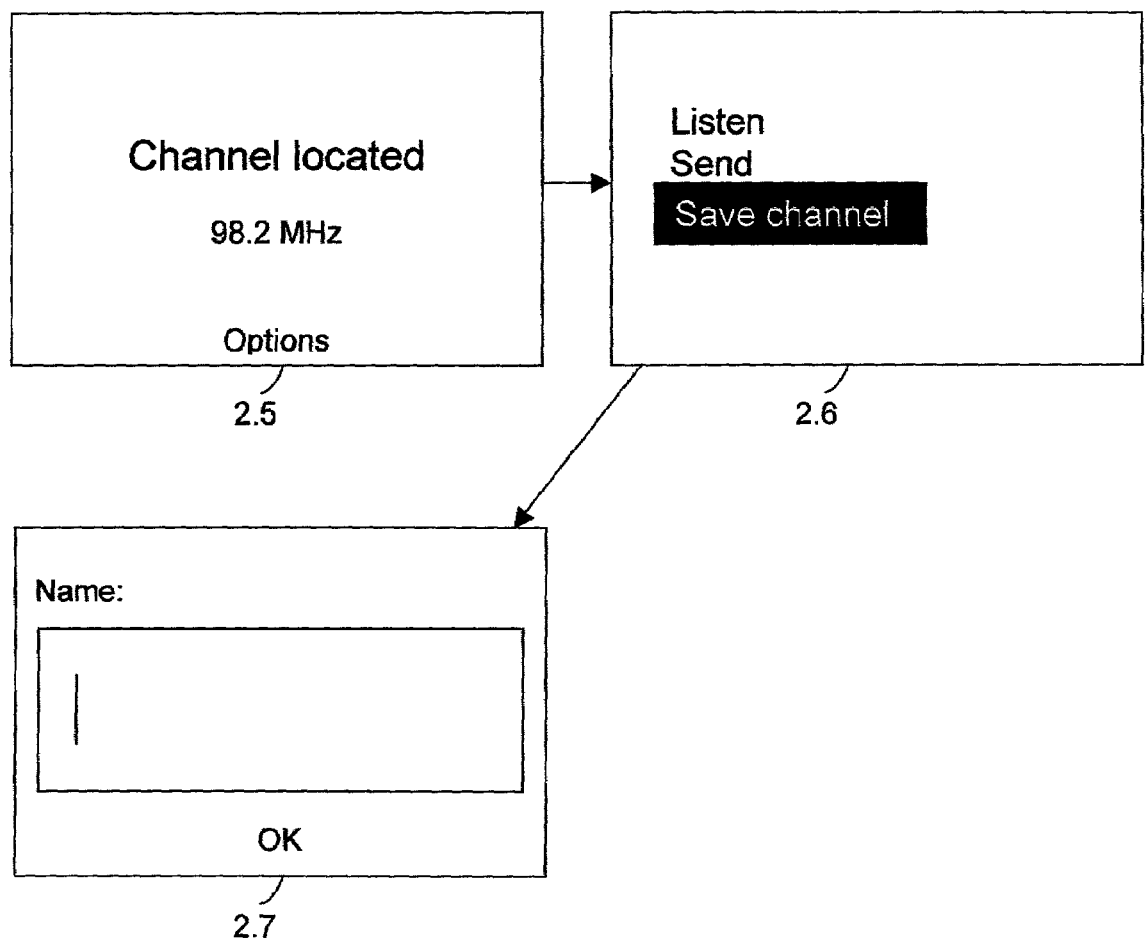

Text messages, such as SMS-messages, are a useful extension of the use of mobile phones. The technical specifications for the GSM Short Message Service are defined in: ETSI TS 100 901 V7.4.0 (1999-12), Technical Specification, Digital cellular telecommunications system (Phase 2+); Technical realization of the Short Message Service (SMS); (GSM 03.40 version 7.4.0 Release 1998), hereby incorporated by reference. The messages may contain plain text, ringing tones, picture messages, WAP settings and business cards (Vcard). The type of message is coded in the user data header. The user data header is indicated in the first octet of the SMS-Submit TPDU (with message parameter value).

According to the present invention, a message sent to a mobile phone contains radio channel settings. The user data header of the radio channel setting message contains information that allows a mobile phone to recognize the message as radio channels setting. The message itself contains at least the frequency of a radio channel. The radio channel setting message may further contain channel name, program type, and comments and other information.

According to a preferred embodiment of the invention, a message containing a radio channel setting has the format BEGIN:FMRADIOSET
   VERSION: 1.0
   SETN: Copenhagen FM
   N1: RIX FM
   F1: 08960
END:FMRADIOSET SETN indicates the geographical area for which the radio channel setting applies. N1 indicates the radio channel name and F1 indicates the radio channel frequency.

According to another embodiment of the invention, the message may contain several radio channel settings in the format:

BEGIN:FMRADIOSET
   VERSION:1 . . . 0
   SETN: Copenhagen FM
   N1: RIX FM
   F1: 08960
   N2:NRG
   F2:09000
END:FMRADIOSET According to a further embodiment of the invention the message containing a radio channel setting includes program type or genre, a radio program title and a date and time for the start of the radio program:

BEGIN:FMRADIOSET
   VERSION:1 . . . 0
   SETN: Copenhagen FM
   N1: RIX FM
   F1: 08960
   G1: POP
   E1: 091201 1530 TOP 50
END:FMRADIOSET G1 indicates the title of the radio program. E1 is a radio program starting date and time: Dec. 9, 2001, called TOP 50.

The radio channel settings of a mobile phone are updated by sending a message as described above to the mobile phone. The mobile phone identifies the message as being a radio channel setting by the information in the user data header.

The radio channel setting may either be automatically stored in a radio channel memory of the mobile telephone, or, as explained below, it is up to the user of the mobile phone to choose what to do with the received radio channel setting.

Conventional radio broadcasting is based on transmission of channels at assigned frequencies from radio towers that cover a certain geographical area. The frequency of a radio channel is therefore only relevant in the geographical area where the signal is strong enough for proper reception of the signal. Thus, one or more radio station settings may be assigned to different geographical areas.

The mobile phone network keeps track of the location of the mobile phone in a well-known manner descried in e.g., the enhanced observed time difference (E-OTD) method. This method described in GSM 04.35 version 8.0.0 Release 1999, ETSI TS 101 528 V8.0.0 and ETSI TS 101 527 V8.1.0, which are hereby incorporated by reference. Alternatively, the location of the phone can simply be determined according to the network cell in which the mobile phone is registered.

According to an embodiment of the invention, the radio channels settings are automatically updated during location change. When a change of geographical area is detected, a message containing radio channel settings assigned to the geographical area to which the mobile phone has moved, is sent to the mobile phone. Such a message could be sent by a service provider subscribed to by the user of the mobile phone. Thus, the user does not have to tune the radio stations manually when traveling.

A message with radio station channels assigned to a particular geographical area can also be sent when a mobile phone logs on to the network in that particular geographical area.

According to another embodiment it is also possible that specific channel settings are requested by sending a message from a mobile phone to a service provider, and the service provider sending the requested radio channel settings back to the requesting mobile phone. Such requests could e.g. be requests for radio channel settings of channels belonging to a specific genre, radio channel settings for a specific geographical area, or radio channel settings along a route between two geographical areas or locations.

One radio station may broadcast from different locations at different frequencies. According to another embodiment of the invention, the mobile phone is automatically tuned to the frequency with the strongest signal at which a particular radio station is transmitting in the geographical area in which the phone is located. The network keeps track of the geographical area in which the mobile phone is located. The frequency of the radio channel of the particular station that has the strongest signal in that area is sent to the mobile phone whenever the mobile phone changes geographical area. The broadband AM and/or FM radio signal receiver is automatically tuned to the last received radio channel setting. Thus, the phone is automatically kept tuned to the frequency with the strongest signal in the area in which the phone is located.

Figure 3:
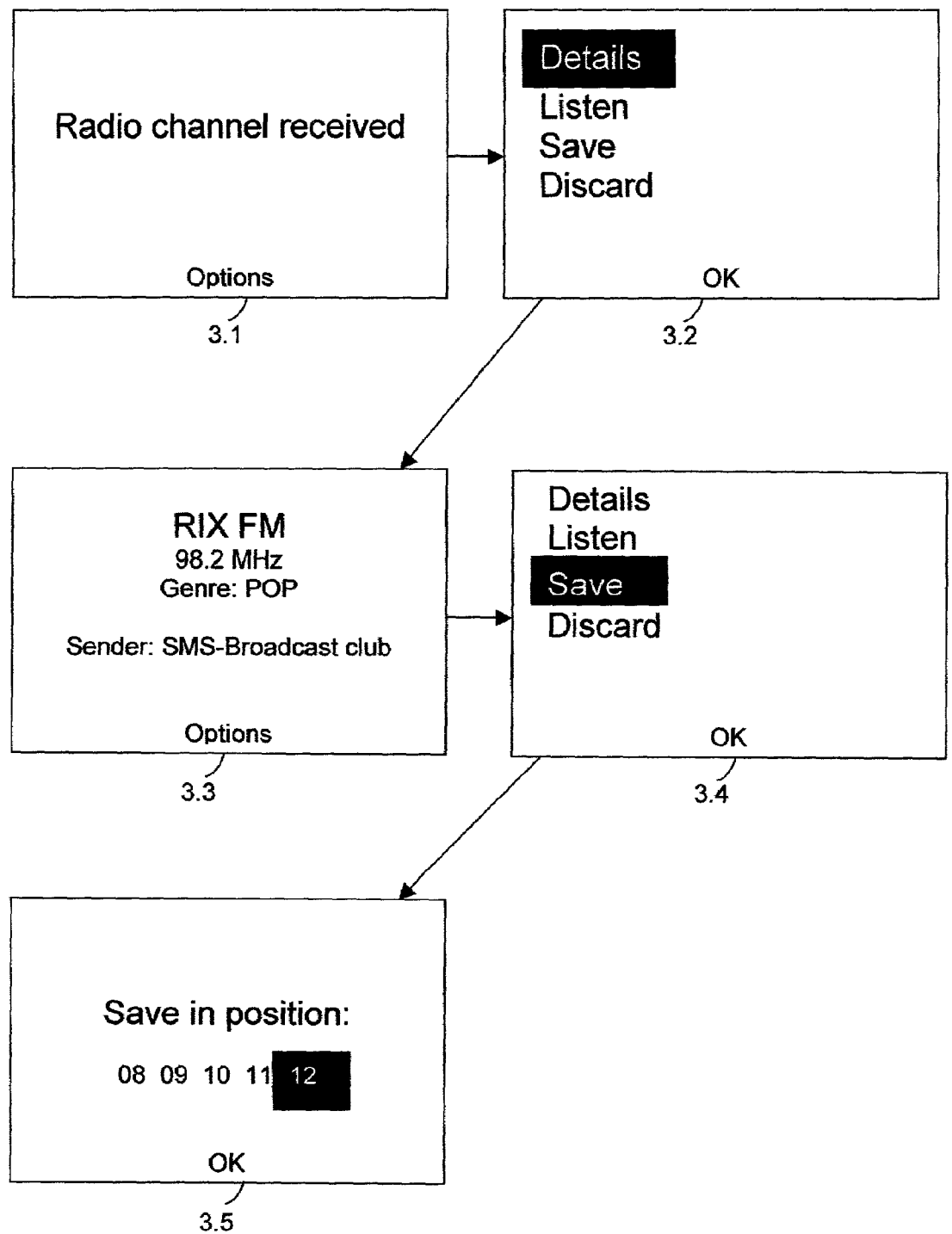
Figure 4:
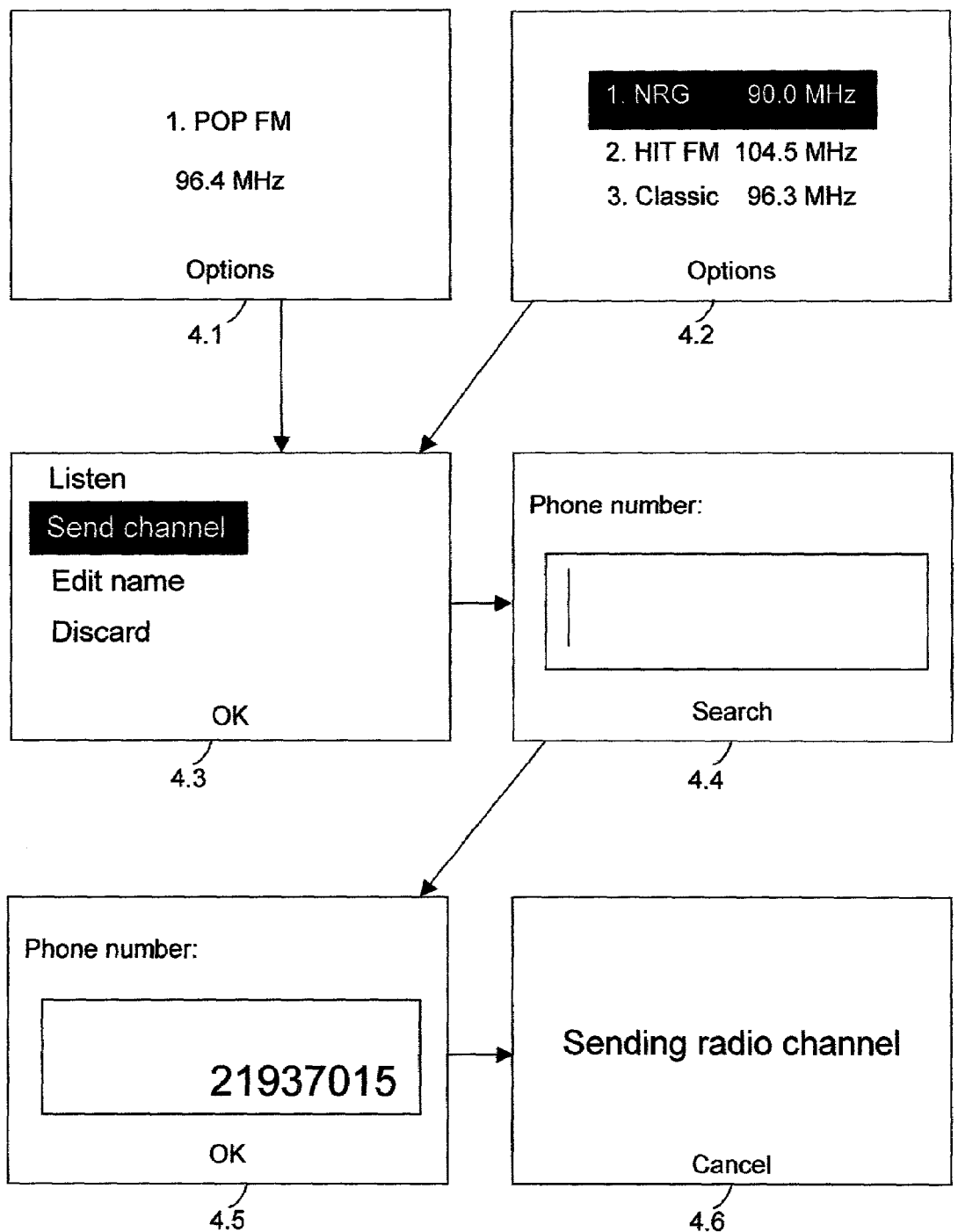

According to another embodiment, the message also comprises a date and time for the start of a radio program. Upon receipt of such a message, the user is notified with a tone and a text on the display of the mobile phone displaying that a radio event has been received (FIG. 3a). If the user chooses to store the message in the radio channel memory (see below for details of this step), the broadband AM and/or FM radio receiver is automatically switched on and tuned to the received radio channel setting when the date and time contained in the message is reached. A message containing radio channel settings including a date and a time for the start of a radio program can also be sent from the mobile phone to another mobile phone. The messages an further originate from a server to which the user subscribes.

Alternatively, a message requesting a particular radio channel setting may be sent from the mobile phone to a server and a message containing the requested radio station setting or settings is returned by the server. The request may be directed to channels in a particular geographical area, a particular radio station, a number of particular areas along a route between two geographical locations.

If a message contains more data than possible to send in a single SMS, concated SMS messages may be used.

FIG. 1 shows a preferred embodiment of a mobile phone according to the invention, and it will be seen that the mobile phone, which is generally designated by 1, comprises a user interlace having a keypad 2, a display 3, an on/off button 4, an earpiece 5, and a microphone 6. The keypad 2 has a set of keys 7 for entering data. These keys 7 are in the form of alphanumeric keys, by means of which the user can enter numbers and letters, e.g. a phone number, a text message (SMS) or a name (associated with the phone number). The user uses the first group of keys primarily for entering data in the phone (entry events).

In the preferred embodiment, the keypad 2 additionally comprises a single multi-functionality key 8, a so-called soft key, whose function depends on the present state of the phone. The default function or the present function of the multi-functionality key 8 is displayed in a separate field 11 below a basic screen area 12 of the display 3. Information entered by the data entering keys and information received from the network are displayed in the basic screen area 12. In the preferred embodiment, the keypad additionally comprises a scrolling device which, in the preferred embodiment, is provided as a scroll key 9 for moving a cursor or a cursing bar in two opposite directions. By means of the scroll key 9, the user can jump selectively from one item to the preceding or the succeeding item in the menu loop of the phone, while he gets access to a submenu loop under the item concerned in the main menu loop by activation of the multi-functionality key. The clear key 10 may be used e.g. for erasing the digit or letter entered last by brief depression, while depression of a longer duration will erase the entire number or word. Like the multi-functionality key 8, the scroll key 9 and the clear key 10 may advantageously be redefined in some states.

The user interlace allows thus selection of a variety of available functions e.g. phone book, call register, settings, messages etc. This user interface is as such known from U.S. Pat. No. 6,195,569, hereby incorporated by reference. The mobile phone has text message sending and receiving functionality as defined in ETSI IS 100 901 V7.4.0 (1999-12), Technical Specification, Digital cellular telecommunications system (Phase 2+); Technical realization of the Short Message Service (SMS); (GSM 03.40 version 7.4.0 Release 1998). The mobile phone recognizes different message types such as those containing ringing tones, picture messages, WAP settings and business cards (Vcard) by the corresponding information in the user data header. The mobile phone further recognizes text messages containing radio channel settings by the radio channel setting header discussed above.

The mobile phone I also receives broadband AM (Amplitude Modulation) and/or FM (Frequency Modulation) radio signals via a broadband AM and/or FM receiver. The mobile phone has an input signal path for receiving FM and/or AM radiobroadcast signals. An FM antenna, which is also the wire of the headset, receives radio signals transmitted in the FM range, i.e., 87.5 to 107.9 MHz. The mobile phone has a memory comprising preferably at least 20 channel locations for storing radio channels. In order to receive a particular radio channel, the user operates the radio menu of the user interface to tune the FM receiver. The user interlace accordingly signals a microprocessor which drives a phase locked up circuit accordingly.

With reference to the flow charts in FIGS. 2, 2a, 3 and 4, the radio functions are described in more detail. To turn on the radio, the multi-functionality key 8 "Menu" is pressed (state 2.1). The radio submenu is selected by using the scroll button 9 to browse through the submenus and pressing the multi-functionality key 8 "OK" again (state 2.2). The display 3 now shows the channel location numbers, the name of the radio channels and the frequency of the radio channels (state 2.3). The user can scroll to the desired channel by using the scroll key 9, and select one by pressing the multi-functionality key 8 "options". Then a menu is displayed with the choice of listening, sending editing or erasing the channel (state 2.4). Selecting preset channels 1 to 9 is also possible by pressing the corresponding number key on the keypad 2.

When the radio is on, pressing and holding the scroll button 9 will start a channel search. Searching stops when a channel is located. To save the channel, the multi-functionality key 8 "Options" is pressed (state 2.5). Using the scroll button 9, "Save channel" can be selected, and by pressing the multi-functionality key 8 "OK" (state 2.6) the channel can be stored. The user interlace now prompts for entering a name for the channel (state 2.7). After entering the name and selecting "OK" the channel will automatically be saved in one of the free channel locations. If there are no free channel locations, the user interlace will prompt for selecting a location to overwrite (state 3.5).

When a text message containing a radio station setting is received, the user interface displays a soft notification "Radio channel received" (state 3.1). Upon pressing the multi-functionality key 8 "Options" the user interface displays the options "Details", "Listen", "Save" and "Discard (state 3.2). By using the scroll key 9 the user can select either of these three options. Selecting Details" and pressing the multi-function key 8 "OK" will result in the display showing the name of the radio channel and the frequency of the radio channel (state 3.3). By pressing the multi-functionality key 8 "Options" the display turns to state 3.4. By selecting "Save" and pressing the multi-functionality key 8 "OK" the channel will automatically be saved in one of the free channel locations. If there are no free channel locations, the user interface will prompt for selecting a channel location to overwrite (state 3.5).

When listening to a radio station (state 4.1) or when having a radio station marked (state 4.2), the user interlace will show the function "Options" above the multi-function key 8. After pressing the multi-function key 8 "Options" the user interface allows browsing with the browser button 9 through the options: "Listen", "Send channel", "Edit name" and "Discard" (state 4.3). After selecting "Send channel" and pressing the multi-function key 8 "OK" the user interface prompts for a phone number to send the channel setting to (state 4.4). After entering the number with the number keys the display above the multi-function key changes to "OK" (state 4.5). After pressing the multi-functionality key 8 "OK" (state 4.5) the message is sent. Alternatively, the phone number can be recalled from the phone book by pressing the multifunction key "Search" (state 4.4). The following phone number selection from the phone book is not shown here, and is well known from e.g. the Nokia® 3310 mobile phone and the Nokia® 3310 User Manual which is hereby incorporated by reference.

While the message is being sent the user interface will display "Sending channel setting" (state 4.6). The user still has a chance to interrupt the transmission by pressing the multi-function key 8 "Cancel".

The mobile telephone further comprises a dock that can activate the broadband AM and/or FM radio signal receiver, when a stored date and time has been reached. The mobile phone further has a storage to store a date and time received in a radio channel setting to allow activation of the broadband AM and/or FM radio signal receiver and tune it to the radio channel setting contained in the message when this date and time as been reached.

Although the invention is shown with a single multi-function key, it is clear that the present invention also can be carried out with two or more multi-function keys without departing from the scope of the invention.

The invention claimed is:

1. An apparatus comprising:
 a receiver configured to receive messages transmitted via a mobile phone network;
 a user interface;
 a broadband AM and/or FM radio signal receiver configured to determine a plurality of radio channel settings of a broadband AM and/or FM radio station based on at least one of the received messages;
 a radio channel memory configured to store the plurality of radio channel settings of a broadband AM and/or FM radio station received in the messages with the receiver;
 a storage configured to store a radio channel setting contained in a received message transmitted via the mobile phone network in the radio channel memory; and
 a detector configured to detect that a message contains a radio channel setting;
 wherein a menu of the user interface is activated when a message containing a radio channel setting is received, the menu displays prompts for either listening to the received radio channel, saving the received radio channel setting, viewing details of the received radio channel setting or discarding the channel setting, and
 wherein a further menu of the user interface is activated when selection of the save the radio channel setting prompt is received, the further menu displays a prompt for selecting one of the channel location numbers of the radio channel memory.

2. An apparatus comprising:
 a receiver configured to receive messages transmitted via a mobile phone network;
 a broadband AM and/or FM radio signal receiver configured to determine a plurality of radio channel settings of a broadband AM and/or FM radio station based on at least one of the received messages;
 a radio channel memory configured to store the plurality of radio channel settings of a broadband AM and/or FM radio station received in the messages with the receiver; and
 a storage configured to store a radio channel setting contained in a received message transmitted via the mobile phone network in the radio channel memory;
 wherein the receiver receives messages containing radio channel frequency and/or name and time and date of a radio program, the apparatus further comprising a control which activates the broadband AM and/or FM radio signal receiver and tunes the radio signal receiver to a received channel when the time and date of the received radio program has been reached.

3. A method comprising:
 sending a first message containing a radio channel setting of a broadband AM and/or FM radio station via a mobile phone network to a mobile phone to update mobile phone radio channel settings, wherein the mobile phone comprises a receiver for receiving messages via the mobile phone network and a broadband AM and/or FM radio receiver which receives messages;
 assigning radio channel settings to different geographical areas;
 determining in which geographical area the mobile phone is located; and
 sending a second message to the mobile phone containing at least one radio channel setting assigned to the geographical area in which the mobile phone is located.

4. A method according to claim 3, wherein the second message containing the at least one radio channel setting assigned to the geographical location in which the phone is located, is sent when the mobile phone has moved from one geographical area to another or when the mobile phone logs on to the mobile phone network in the geographical area.

* * * * *